United States Patent [19]

DeGree et al.

[11] Patent Number: 4,666,545
[45] Date of Patent: May 19, 1987

[54] METHOD OF MAKING A MOUNTING BASE PAD FOR SEMICONDUCTOR DEVICES

[75] Inventors: David C. DeGree, Burnsville; Carl R. Bergquist, Minnetonka; Dallas R. Humphrey, Golden Valley; Roger A. West, Woodbury, all of Minn.

[73] Assignee: The Bergquist Company, Minneapolis, Minn.

[21] Appl. No.: 625,140

[22] Filed: Jun. 27, 1984

[51] Int. Cl.⁴ .................. B32B 31/18; F28F 7/00; H01B 19/04

[52] U.S. Cl. .................... 156/252; 156/257; 156/297; 165/185; 174/138 G; 174/16 HS

[58] Field of Search .......... 156/257, 252, 250, 211, 156/221, 226, 227, 297, 329; 165/185; 174/138 G, 16 HS

[56] References Cited

U.S. PATENT DOCUMENTS 3,427,715  2/1969  Mika ................... 156/211
3,673,543  6/1972  Garner ................. 174/138 G
4,572,757  2/1986  Spadafora .............. 156/252

OTHER PUBLICATIONS

"Silastic RTV" 1961, Dow Corning Corporation.

Primary Examiner—Donald E. Czaja
Assistant Examiner—J. Davis
Attorney, Agent, or Firm—Orrin M. Haugen; Thomas J. Nikolai

[57] ABSTRACT

A mounting pad means for use in combination with solid-state semiconductive translating devices and including a base pad with flange walls extending from said base pad, and with device mounting pad means being secured to the surface of the base pad and comprising a thin layer of silicone base rubber. The base pad and flange walls are formed of a generally rigid laminate with a core having outer metal foil layers disposed on opposite surfaces thereof, and wherein the core is composed of a thin layer of silicone base rubber.

2 Claims, 9 Drawing Figures

METHOD OF MAKING A MOUNTING BASE PAD FOR SEMICONDUCTOR DEVICES

BACKGROUND OF THE INVENTION

The present invention relates generally to an improved mounting means for use in combination with solid-state semiconductive translating devices such as transistors, diodes, or the like, and wherein the mounting means provides a heat sink or other means of dissipating heat, as well as a mechanical mounting device. The arrangement of the invention is such that the mounting means which may be fabricated from a formable metal base, may be either a solid metallic pad or a pad formed as a laminate with outer metal foil layers disposed on opposite surfaces of a thermally conductive pliable pad or layer such as a silicone rubber core. The arrangement facilitates and permits the use of relatively thin layers of metal foil such as aluminum or copper, which is stiffened or rendered rigid by the forming of the structure.

It has long been recognized that the proper utilization of solid-state semiconductive translating devices requires a system for dissipating the heat generated in the normal use and operation of these devices. Specifically, as the power requirements of the semiconductive translating devices increases, the need for heat dissipation correspondingly increases. While metallic layers, that is layers of aluminum or copper, may be readily employed for heat-dissipating mounting means, the cost involved in fabricating, working and mounting such devices renders it desirable to employ alternate materials of construction for the mounting means. However, as alternate materials are proposed for ease of handling and fabrication, these alternate means have normally suffered from an inability to dissipate thermal energy, and thereby impose an unreasonable constraint or limitation upon the operational characteristics of the solid-state semiconductive translating device mounted thereon. For most purposes, however, metals such as aluminum or copper are the material of choice for these applications, particularly in view of the electrical and thermal properties of these materials.

SUMMARY OF THE INVENTION

In accordance with the present invention, therefore, a mounting means is provided for use in combination with solid-state semiconductive translating devices which is highly thermally conductive, and which employs a formable metallic base pad in the form of a solid metal sheet or a pair of outer metal foil layers disposed on opposite surfaces of a thermally conductive adherent core layer such as a silicone rubber core. The structure is rendered generally self-supporting and rigid so as to facilitate handling and working. In the laminated structure, the utilization of the pair of metallic foil layers on opposite sides of the silicone base rubber core provide a relatively highly thermally conductive system for heat dissipation.

In the preparation of the base heat sink, various forms may be employed such as an extrudedor stamped metal part, a machined metal component, a metallic foil, or a laminated metallic-nonmetallic system. The common element between each of these forms is, as indicated, that the thermally conductive material be deformable as a base pad.

The mounting arrangement also includes a thermally conductive insulator which may be integral with the base heat sink element or semiconductor base. The thermally conductive insulator material, normally silicone rubber, is applied to the material as a coating, composite, or an adhesively applied material such as may be continuously applied through a coating operation onto the surface of the metallic component. While the thermally conductive material is preferably applied directly to the heat sink surface, in certain instances and depending upon the design of the transistor or other semiconductor assembly, it may alternatively be applied directly to the semiconductor device.

When the thermally conductive insulator material is applied to a surface as a coating, various opertions may be employed such as spray, dip, brush, roller coating, or silk-screen technique. When the insulator is pre-applied to the surface of the metallic heat sink element, the ultimate bonding of the semiconductor device to the pre-formed composite may also be achieved through conventional adhesive bonding operations or vulcanization.

The system of the present invention is highly useful in combination with semiconductive translating devices which are destined for mounting upon printed circuit boards. This system further provides a means for securing the semiconductive device to the mounting means so that direct or adhesive assembly operations can be undertaken so that direct assembly operations can be undertaken either on a strip-basis or, in certain instances, on a reel-to-reel basis. Also, the mounting means may include use of a conductive adhesive for electrical coupling to the solid-state semiconductive device, if desired.

The mounting means of the present invention may be conveniently fabricated in an elongated strip form. In this connection, the fabrication operation may include the initial preparation of an elongated strip of a generally rigid but deformable metal such as a metallic strip or sheet or as a laminate with outer metal foil layers. Score lines may be formed longitudinally along the elongated strip to provide fold lines for the devices. Also, deep score lines may be formed transversely at regularly spaced intervals to form a break-off line for the separation of individual semiconductor assemblies or mounting pads from an elongated strip containing a large number of repeating units.

Therefore, it is a primary object of the present invention to provide an improved mounting means for use in combination with solid-state semiconductive translating devices which comprises a base pad having flange walls coupled to opposed side edges thereof, and with the base pad and flange walls comprising a generally rigid but deformable base with a thermally conductive layer being secured or applied to the surface thereof.

It is yet a further object of the present invention to provide an improved method for the fabrication of mounting means for use in combination with solid-state semiconductive translating devices wherein there is initially prepared an elongated strip of a generally rigid but deformable and self-supporting metal pad or metallic laminate pad with a core having outer metal foil layers disposed on opposite surfaces thereof. Parallelly disposed score lines are formed along the strip to faciliate formation of the mounting means, and wherein transversely disposed score lines are formed along the elongated strip to form break-off lines defining or delineating individual assemblies or individual mounting pad structures.

Other and further objects of the present invention will become apparent to those skilled in the art upon a study of the following specification, appended claims and accompanying drawings.

DESCRIPTION OF THE PREFERRED EMBODIMENT

Figure 1:
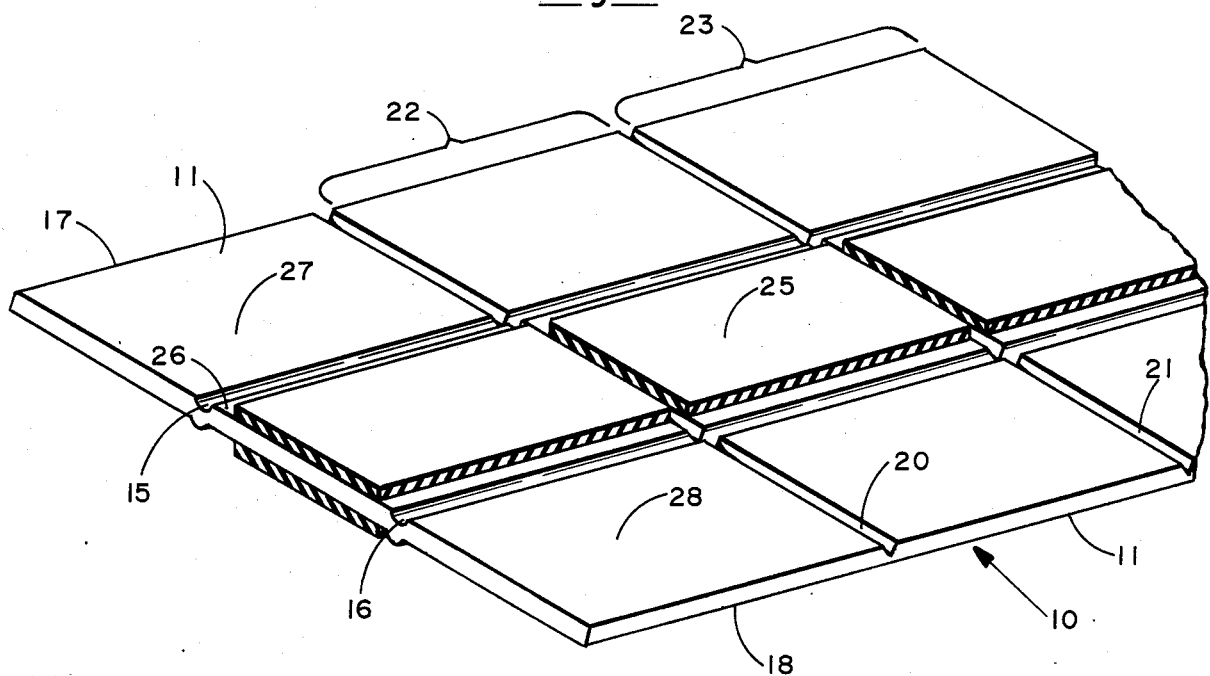
FIG. 1 is a perspective view of a portion of an elongated strip formed for the preparation of individual mounts for semiconductive devices, and with FIG. 1 illustrating the strip and semiconductor mounting means in semi-finished form.

In accordance with the preferred embodiment of the present invention, and with particular attention being directed to FIG. 1 of the drawings, the elongated strip member generally designated 10 includes a repeating structure in the form of a plurality of base pad members 11—11. The strip 10 is provided with a pair of generally parallelly disposed score lines 15 and 16 along said elongated strip at a point spaced inwardly from the outer edge surfaces 17 and 18 thereof. Furthermore, spaced-apart transversely arranged score lines as at 20 and 21 are formed along the elongated strip 10 to facilitate a breaking-off of individual mounting pad means 11—11 such as the individual pad means 11—11 encompassed by brackets 22 and 23 for example.

In order to facilitate mounting of a solid-state semiconductive translating device on the surface of the laminate structure, device mounting electrically insulating-thermally conducting pad means such as 25—25 may be secured or bonded to the surface of the central base pad portion 26 of the elongated strip 10. Base pad central portion 26 is flanked by flange walls 27 and 28, with flange walls 27 and 28 being coupled and integral with base pad portion 26. In other words, flange walls 27 and 28 are extensions of base pad portion 26, and are coupled to the opposed side edges thereof.

As indicated above, the metallic member 11 is preferably highly thermally conductive. Copper and aluminum are, of course, the most desirable materials, since each are widely commercially available in a wide variety of thickness dimensions. For most purposes, copper and aluminum foil with a thickness of between about 2 and up to about 200 mils is useful. In connection with these materials, it will be noted that in general, metallic foil thicknesses ranging up to about 125 mils may be advantageously employed.

Figure 2:
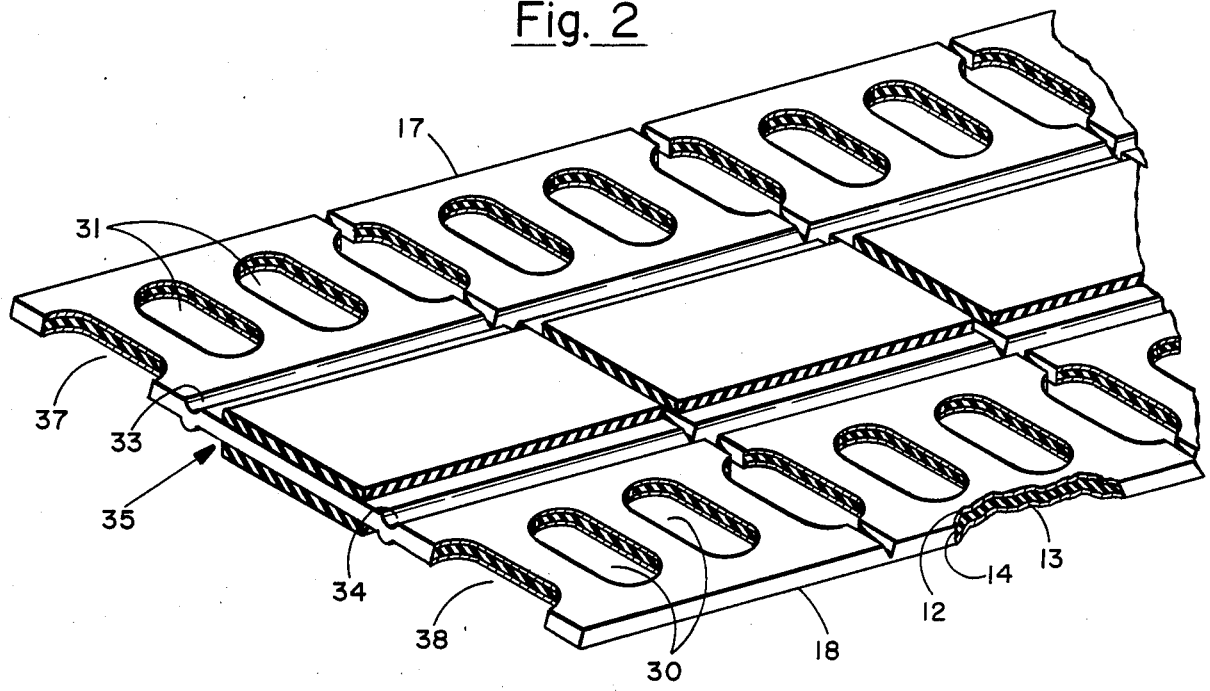
FIG. 2 is a view similar to FIG. 1 and illustrating a modified form of semiconductor mounting means prepared in accordance with the present invention.

The elongated strip illustrated in FIG. 2 shows a modified structure. Specifically, the base portion of the modification shown in FIG. 2 includes a pair of outer metal foil layers 12 and 13 disposed on opposite surfaces of a thermally conductive core 14 consisting of silicone rubber. The metallic layers, preferably metallic foil layers 12 and 13, are highly thermally conductive, and copper and aluminum are the materials of choice. For most purposes, the copper and/or aluminum foil is formed with a thickness of between about 2 and 5 mils each. In connection with these materials, it will be noted that metallic foil thicknesses ranging up to in excess of 5 mils each may be satisfactorily employed.

The core material 14 is preferably silicone base rubber, and silicone base rubbers are, of course, widely commercially available. Such silicone base rubbers have adhesive properties, and hence may be readily employed as the core material for securing and bonding layers of metal foil to opposite surfaces thereof. Preferably, the silicone base rubber material forming the core has a thickness of between about 8 mils and 12 mils.

The combination of metallic foil layers on opposite surfaces of a core provide a generally rigid laminate with desirable mechanical and thermal properties. The material is sufficiently durable so as to withstand exposure to the normal events occurring during manufacture and use of conventional solid-state semiconductive translating devices.

The structure of FIG. 2 includes a plurality of openings or bores formed as at 30—30 and 31—31. Specifically, bores 30—30 and 31—31 are regularly spaced elliptical bores formed along the flange portion of the elongated strip. These bores are formed generally laterally outwardly of the parallelly disposed score lines 33 and 34, and with the major axes of each of the bores being generally normal to the longitudinal axis of the elongated strip member. In the illustration of FIG. 2, the axis of elongated strip member generally designated 35 is, of course, normal to the major axis of the individual elliptically shaped bores. Also, the transverse score lines for the break-off zones are formed generally coincidentally with the major axes of one laterally disposed pair of elliptical bores, such as the laterally disposed pair of partial elliptical bores shown partially as at 37 and 38. It will be appreciated, of course, that the configuration of the individual bores formed in the pad material is not critical. Circular, rectangular, or other regularly shaped bores may, of course, be appropriately utilized. The purpose of the bores is to assist in the flow of cooling air around and through the device.

Figure 3:
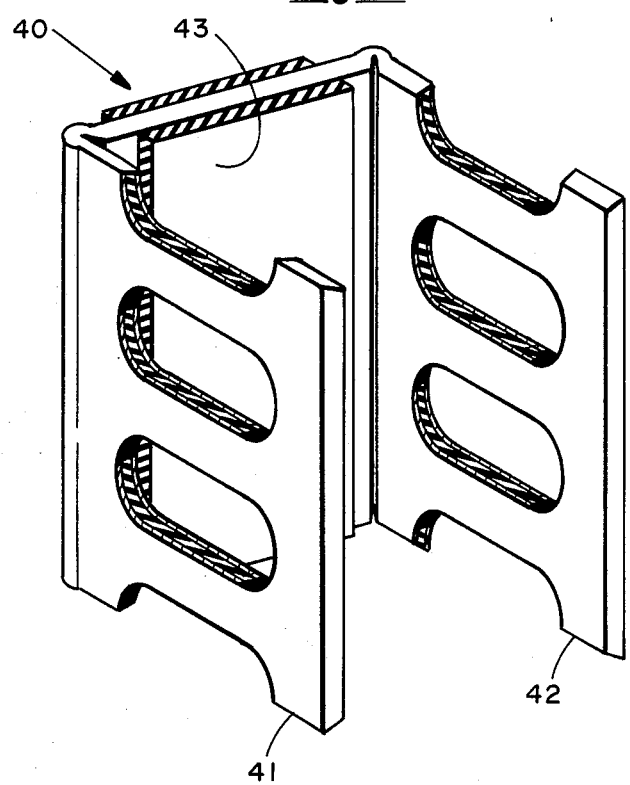
FIG. 3 is a perspective view of a mounting means for use in combination with solid-state semiconductive translating devices, and prepared from a portion only of the elongated strip illustrated in FIG. 2.

Attention is now directed to FIG. 3 of the drawings wherein mounting pad 40 is illustrated formed as a fragmentary portion of strip 35 of FIG. 2. In this view, the edge portions 41 and 42 have been folded inwardly to create a channel-like member to receive a semiconductor device along the base pad central portion 43. For affecting a bond between the bonding pad assembly and a suitable substrate, a second thermally conductive insulator pad is formed in opposed relationship to the base pad 43.

Figure 4:
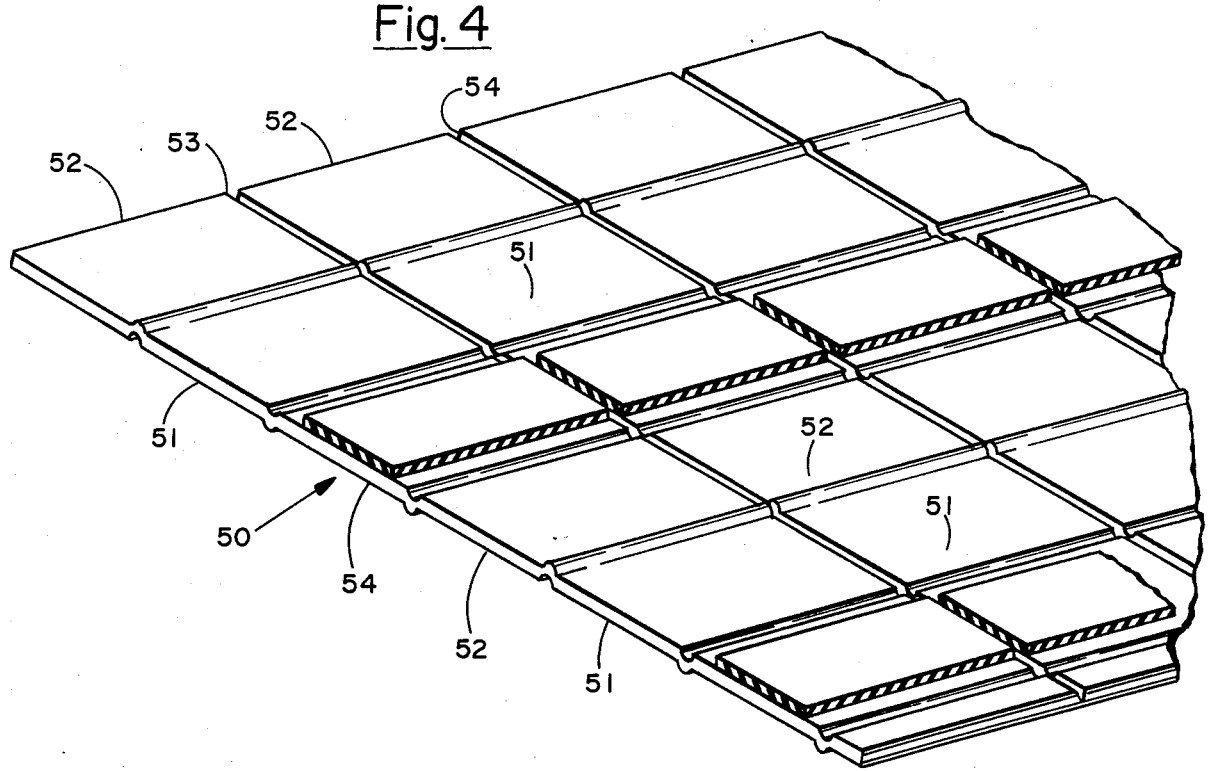
FIG. 4 is a perspective view of an elongated strip from which a plurality of mounting means for solid-state semiconductive translating devices may be fabricated.
Figure 5:
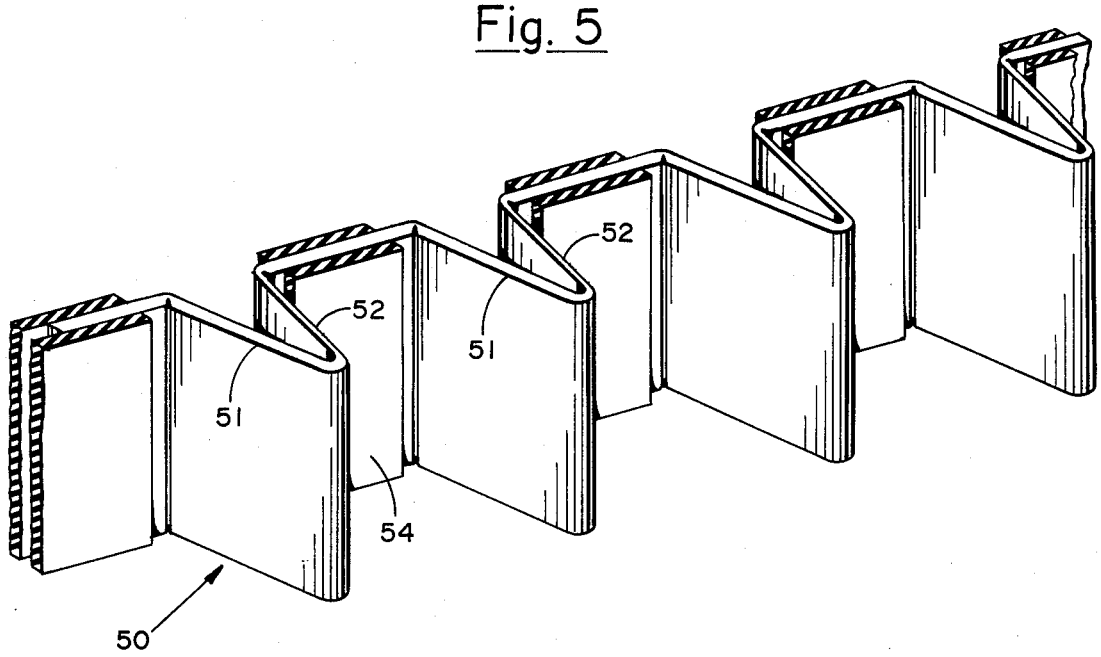
FIG. 5 is a perspective view of the elongated strip of FIG. 4, and after the strip of FIG. 4 has undergone accordion-type folding.

Attention is now directed to FIG. 4 of the drawings wherein a modified form of elongated strip 50 from which individual mounting means may be formed is illustrated. Specifically, the elongated strip 50 of FIG. 4 provides the same ingredients or elements as are available from that shown in FIGS. 1 and 2, with the exception being the utilization of an accordion-fold arrangement as illustrated in FIG. 5, wherein the mutually adjacent flange portions 51—51 and 52—52 are folded in accordion-pleat fashion on opposite sides of a center base pad member as at 54. Score lines are formed at the juncture point between individual members 51—51 and 52—52 as at 53 and 54 so as to separate the strip into individually useful mounting pad means.

Figure 6:
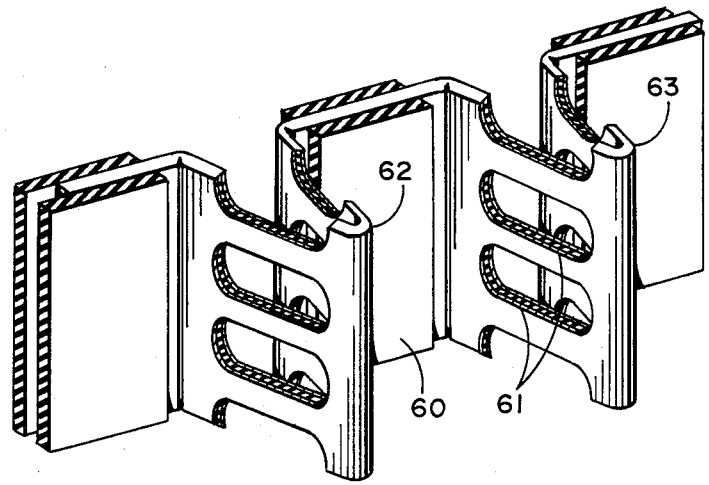
FIG. 6 is a view similar to FIG. 5, and illustrating a modified form of strip from that illustrated in FIG. 4, and incorporating the perforation operations as illustrated in FIG. 2.

With attention being directed to FIG. 6, a mounting means having perforations formed therein similar to those shown in FIG. 2 is illustrated. In this connection, the pad means 60 is formed in a fashion similar to that of FIG. 5, with the exception being the formation of the perforations as at 61—61 between what becomes individual pads upon severing or breaking along the score lines 62 and 63.

Figure 7:
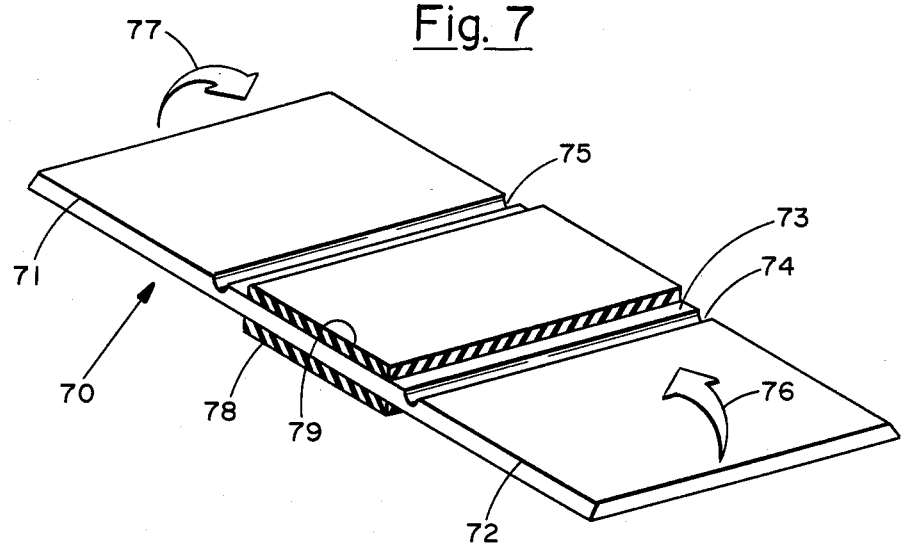
FIG. 7 is a perspective view of a single mounting means portion after having been broken-off of the elongated strip illustrated in FIG. 1.

Attention is now directed to FIG. 7 wherein a single mounting means 70 is shown. Pad 70 includes the flange elements 71 and 72 disposed on opposite sides of the base pad 73. Score lines are formed as at 74 and 75 to permit inward and upward folding of flanges 71 and 72 in accordance with the arcuate arrows as at 76 and 77. In addition, silicone rubber pads are provided as at 78 and 79. Pad 78 facilitates direct mounting of the member 70 onto a chassis surface and/or printed circuit surface, while pad 79 permits direct mounting of the solid-state semiconductive translating device. One significant advantage derived from pre-assembly of these devices is the virtual elimination of air entrapment, thereby enhancing the thermal conductivity capability of the overall assembly.

Figure 8:
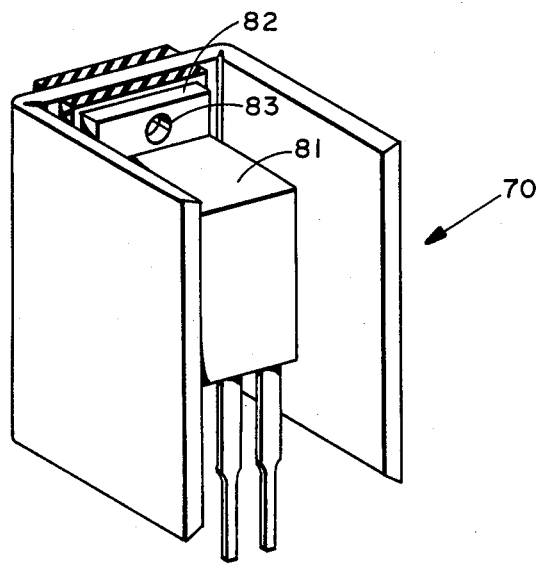
FIG. 8 is a perspective view of the device illustrated in FIG. 7, but further illustrating the device after a solid-state semiconductive translating device has been secured to the base pad portion thereof.

Attention is now directed to FIG. 8 wherein mounting member 70 is equipped with a solid-state semiconductive translating device such as device 81. Device 81 is in the form of an encapsulated solid-state semiconductive translating device, the back of which consists of a metallic mounting bracket or member 82. A bore may be formed in bracket member 82 as at 83 to accept a screw for mounting onto a chassis member, if desired for the specific application.

Figure 9:
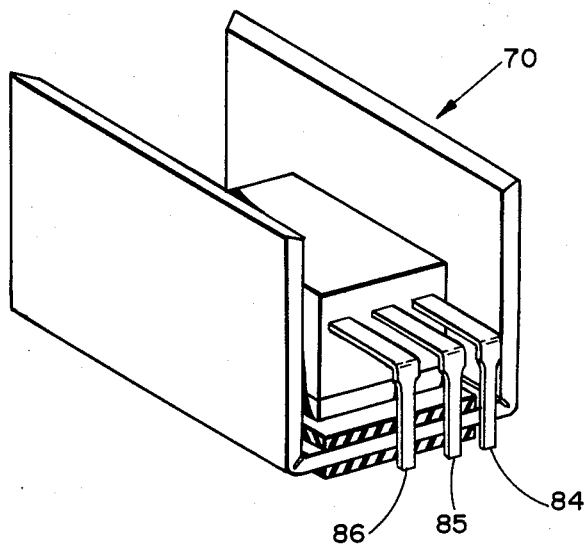
FIG. 9 is a perspective view of the mounting means and solidstate semiconductive device illustrated in FIG. 8, and further showing the device with the lead tines being bent downwardly to accommodate mounting on a conventional printed circuit board.

Attention is now directed to FIG. 9 of the drawings wherein the assembly of FIG. 8 is subjected to a further operation wherein the individual tine leads 84, 85 and 86 are bent downwardly at right angles along the length thereof so as to permit the direct mounting of the device onto a printed circuit board.

THE FORMABLE METAL BASE

The formable metal base is utilized as the primary thermal conducting material. As has been indicated, the metallic base is preferably copper or aluminum, because of its desirable thermal, electrical, and mechanical properties, and is available and usable as an extruded metal part, extruded on an elongated basis, a machined metal part, a metal foil, either solid metal or a laminated metal structure with a thermally conductive core. In each of these instances, the structure is such that it can be readily formed with simple hand tools and without need for heavy metal presses, metal bending equipment, or the like. Also, as indicated above, the thickness of individual layers in a laminate should be selected in the area of about 5 mils, with certain composite structures up to a thickness of about 125 mils being usable. As suggested hereinabove, the base pad assembly may be formed in either strip-form, or alternatively on a reel-to-reel basis. Such fabrication techniques enhance the rate of production of the devices.

THE THERMAL CONDUCTING INSULATOR

As indicated above, this material is preferably fabricated from silicone rubber, and may be applied as a coating, a composite, or as an adhesive pad. The substance of the present invention eliminates the need for a loose insulator element, such as a mica-pad or the like.

The thermally conducting insulator is preferably applied to the surface of the metallic foil, as is indicated in the assemblies of FIGS. 1 and 2, for example. In certain applications, the thermally conducting insulator may be applied to the base of the semiconductor device undergoing consideration. Also, the application technique is selected and undertaken in such a way that air entrapment is either avoided or substantially reduced so as to increase the overall thermal conductivity properties of the device.

FORMING THE THERMALLY CONDUCTING INSULATOR

The thermally conducting insulator may be applied and/or formed by conventional techniques including spraying, dipping, brushing, screening, roller coating, or transfer coating techniques. These applicating techniques are commonly used with materials including the desired material of the present invention, silicone rubber.

In these application techniques, the thermally conducting insulator is secured to the base of the transistor (or other semiconductor translating device) either directly to the base or to the assembly. Adhesive bonding or vulcanization are usable application techniques.

It will be appreciated, therefore, that the mounting means of the present invention facilitates and provides effective use in combination with solid-state semiconductive translating devices, and wherein the base pad is formed of a generally rigid, but both durable and deformable. The structure may be formed as a metallic plate or foil structure, or as a laminate with a silicone rubber core having outer metal layer foil layers secured to opposite surfaces thereof. The combination of the metal foil layers and the silicone rubber core provides a finished product having desirable mechanical properties, along with desired thermal properties including a high degree of thermal conductivity.

SURFACE COATING

The thermally conductive insulative material is formed as a stripe on the overall heat sink structure. The coating, while preferably applied to the heat sink device, may alternatively be applied to the metallic base element of the semiconductor device. As such, a strong adherent and coherent coating is provided in precisely defined and delineated areas, thereby contributing to the overall heat dissipating qualities of the device. Also, it will be appreciated that the surface coating may be employed as a bonding agent for the assembly for bonding or otherwise securing the assembly to a suitable substrate, and/or bonding the semiconductor device to the heat dissipating assembly. As indicated above, the utilization of such a surface coating, for practical purposes, eliminates the formation of any air barrier which impedes or otherwise reduces the thermal performance.

The surface coating may be either bonded through a vulcanizing operation, or otherwise. The stripe may be applied either through transfer coating, or other operations including, for example, silk screening. Because of its excellent release properties, polytetrafluoroethylene film may be employed as a temporary base for silicone rubber coatings. Thus, silicone rubber may be applied to a transistor base through transfer coating techniques utilizing a polytetrafluoroethylene film base pad.

The method of fabricating the mounting means of the present invention is also advantageous from the standpoint of the preparation of elongated strips of material which may be broken-away into individual mounting pad means. Furthermore, the utilization of silicone rubber adhesive pads faciliates direct mounting of a solid-state semiconductive translating device to the surface of the base pad. Such direct-mounting of a solid-state semiconductive translating device may be accomplished with either strip-form assemblies or rolls on a reel-to-reel basis. Such assembly techniques expedite production rates and provide for versatility in manufacture and assembly.

What is claimed is:

1. In the method of fabricating mounting means for use in combination with solid-state semiconductive translating devices and which comprise a base pad having edge surfaces including opposed ends and opposed sides, and with flange walls coupled to opposed side edges of said base pad, and wherein said base pad and flange walls comprise a generally rigid laminate with a core having outer metal foil layers disposed on opposite surfaces thereof and co-extensive therewith, the core being composed of a thin layer of silicone base rubber, and a silicone base rubber mounting pad means being secured to the outer surface of said base pad, wherein said method comprises:
   (a) selecting and preparing an elongated strip of a generally rigid laminate with a silicone rubber core having a thickness of between about 8 and 12 mils and outer metal foil layers disposed on opposite surfaces thereof and co-extensive therewith, with the outer metal foil layers being selected from the group consisting of aluminum and copper and having a thickness of between about 2 and 200 mils;
   (b) forming a first pair of generally parallelly disposed score lines longitudinally along the surface of said elongated strip at a point spaced laterally inwardly from the outer edge surfaces thereof, and forming a second pair of parallelly disposed score lines transversely at regularly spaced intervals disposed score lines transversely at regularly spaced intervals of said strip to form a breaking-off line for said strip; and
   (c) applying an adherent and coherent film pad of silicone rubber to the outer surface of said elongated strip generally between said parallelly disposed score lines.

2. The method as defined in claim 1 wherein:
   (a) said metallic foil layers have a thickness of up to about 5 mils; and
   (b) a plurality of regularly spaced elliptical bores are formed along said elongated strip generally laterally outwardly of said first pair of parallelly disposed score lines and with the major axis of each of said elliptical bores being generally normal to the longitudinal axis of said elongated strip, and wherein said transverse score lines are formed generally coincidentally with the major axis of one laterally disposed pair of said elliptical bores.

* * * * *